United States Patent
Song et al.

[11] Patent Number: 5,978,275
[45] Date of Patent: Nov. 2, 1999

[54] ERASE AND PROGRAM CONTROL STATE MACHINES FOR FLASH MEMORY

[75] Inventors: Paul Jei-zen Song, Sunnyvale; Keyhan Sinai, Santa Clara, both of Calif.

[73] Assignee: Nexflash, Technologies, Inc., Santa Clara, Calif.

[21] Appl. No.: 09/133,659

[22] Filed: Aug. 12, 1998

[51] Int. Cl.⁶ .............................. G11C 16/04; G11C 7/00
[52] U.S. Cl. .............................. 365/185.29; 365/185.22; 365/185.11; 365/185.17; 365/218
[58] Field of Search ....................... 365/185.29, 185.33, 365/185.11, 185.17, 185.22, 218

[56] References Cited

U.S. PATENT DOCUMENTS

| | | | |
|---|---|---|---|
| 5,717,636 | 2/1998 | Dallbora et al. | 365/185.11 |
| 5,748,528 | 5/1998 | Campardo et al. | 365/185.11 |

*Primary Examiner*—Trong Phan
*Attorney, Agent, or Firm*—Pennie & Edmonds, LLP

[57] ABSTRACT

An erase state machine controls the process of erasing all the memory cells in a selected sector of a flash memory array. The erase state machine includes a sequence of states for controlling generation of high positive and negative voltages, and application of the high positive voltage to all word lines in the selected sector and application of the high negative voltage to the source nodes of all memory cells in the selected sector. A sequence of two discharge states are used to discharge the high voltages from the word lines and source nodes. If an erase operation is aborted while high voltages are being generated, the erase state machine asynchronously transitions to the first of the two discharge states, and then transitions to the second discharge state and then back to a final inactive state during successive state machine clock cycles. Further, the erase state machine simultaneously checks all the cells in the selected sector to see if they are fully erased, without having to use a repeating loop of states for that purpose. The program state machine controls the programming of one page of flash memory cells. It enables the use of $N/2^k$ programming bit latches in the memory array, instead of a full set of N programming bit latches, where N is the number of columns in the memory array and k is a positive integer, thereby alleviating the space constraints normally imposed on programming bit latches in flash memory devices.

9 Claims, 10 Drawing Sheets

ERASE AND PROGRAM CONTROL STATE MACHINES FOR FLASH MEMORY

The present invention relates generally to controlling the erasing and programming of memory cells in electrically erasable non-volatile memory devices, and particularly to state machines for controlling memory cell erasing and programming.

BACKGROUND OF THE INVENTION

The present invention provides synchronous state machines for efficiently handling the erasing and programming of flash memory cells in a flash memory device.

On-chip state machines are used to control the memory erase process in many flash memory devices. However, in many of these devices, when the erase state machine aborts, the discharge of high voltages from internal nodes is not a well controlled process. Race conditions can occur, such as failure of the discharge process to complete prior to the performance of a next operation by the memory device.

It is a goal of the present invention to make the erasing and programming of flash memory cells quick and easy for end users, and to provide mechanisms for appropriately and reliably handling (A) user abort requests to abort an erase or programming operation in mid-process, and (B) device failures in which one or more memory cells fails to erase or program after a reasonable number of erase or program cycles.

SUMMARY OF THE INVENTION

In summary, the present invention provides erase and program state machines for a flash memory device. The erase state machine controls the process of erasing all the memory cells in a selected sector of a flash memory array, and verifying that all the cells in the selected sector have been fully erased. A sector of the flash memory array consists of a portion of the memory array consisting of all the memory cells coupled to all the word lines that share the same sector address. The sector address is typically the m (e.g., six) most significant address bits of the address bit signals used to address one or more cells in the memory device.

The erase state machine is a synchronous state machine that includes a sequence of states for controlling the generation of a high positive voltage (e.g., 10 to 12 volts) and a high negative voltage (e.g., −10 volts), and application of the high positive voltage to all the word lines in the selected sector and application of the high negative voltage to the source and bulk nodes of all the memory cells in the selected sector. The high voltage control states are followed by a sequence of two discharge states, both of which are used to discharge the high voltages from the word lines and source nodes. If an erase operation is aborted by the user while high voltages are being generated and/or applied to the sector word lines, the erase state machine asynchronously transitions to the first of the two discharge states, then transitions to the second discharge state and then back to a final inactive state during successive state machine clock cycles. By providing two successive discharge states, the erase state machine provides a simple mechanism for ensuring that there is sufficient time to discharge the high voltages on the word lines and source nodes of the selected sector, even if the abort occurs just before the beginning of a state machine clock cycle.

Another feature of the erase state machine is that all the cells in the selected sector are checked simultaneously to see if they are fully erased. This enables the erase state machine to use a simple linear sequence of states to check all the memory cells in a memory array sector, without having to use a repeating loop of states for that purpose. This significantly reduces the time required to perform erase verification.

The program state machine controls the programming of one page of flash memory cells, where a page consists of all the memory cells coupled to a particular word line in one sector of the flash memory array. A feature of the program state machine is that it enables the use of $N/2^k$ programming bit latches in the memory array, instead of a full set of N programming bit latches, where N is the number of columns in the memory array and k is a positive integer. Programming bit latches must be located in the main memory array and thus must normally fit within the column spacing constraints of the main memory array. By enabling the use of one programming bit latch for every two, four or eight columns, the program state machine alleviates the space constraints normally imposed on programming bit latches in flash memory devices.

More specifically, the program state machine generates "page portion tracking" signals that keep track of which portion of the selected page (e.g., the even columns or the odd columns) is being programmed, and then loads the program data for the corresponding memory cells from an on-chip SRAM or an external source into the programming bit latches. The selected page portion is then programmed, once again in accordance with the generated page portion tracking signals.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

For ease of explanation, when a signal is at or near Vcc, the normal supply voltage, it will be said to have a boolean or logic value of "1" and when the signal is at Vss, the circuit ground voltage, it will be said to have a boolean or logic value of "0". Similarly, when a signal is activated or "set," it takes on (or transitions to) a boolean or logic value of "1", and when a signal is reset it takes on (or transitions to) a boolean or logic value of "0". With respect to signal states, the terms "boolean" and "logic" shall be used interchangeably.

In a preferred embodiment, Vcc is a supply voltage having a nominal value of 3.3 volts.

The term "upward transition" with respect to the state of a signal shall mean a transition from a logic "0" to a logic "1" value.

The term "high positive voltage" is used in this document to mean the high voltages, such as 10 to 12 volts, used for erasing flash memory cells, and the term "high negative voltage" is used to mean the high negative voltages, such as −10 volts, used for erasing and programming flash memory cells.

The term "boosted Vcc+ voltage" is used to mean a voltage higher than Vcc, such as the boosted Vcc+ voltage used on the drains of the memory cells being programmed to 0 data values. For example, when Vcc is 3.3. volts, Vcc+ is typically 5 volts.

Flash Memory Array Sector Erase Circuitry

Figure 1:
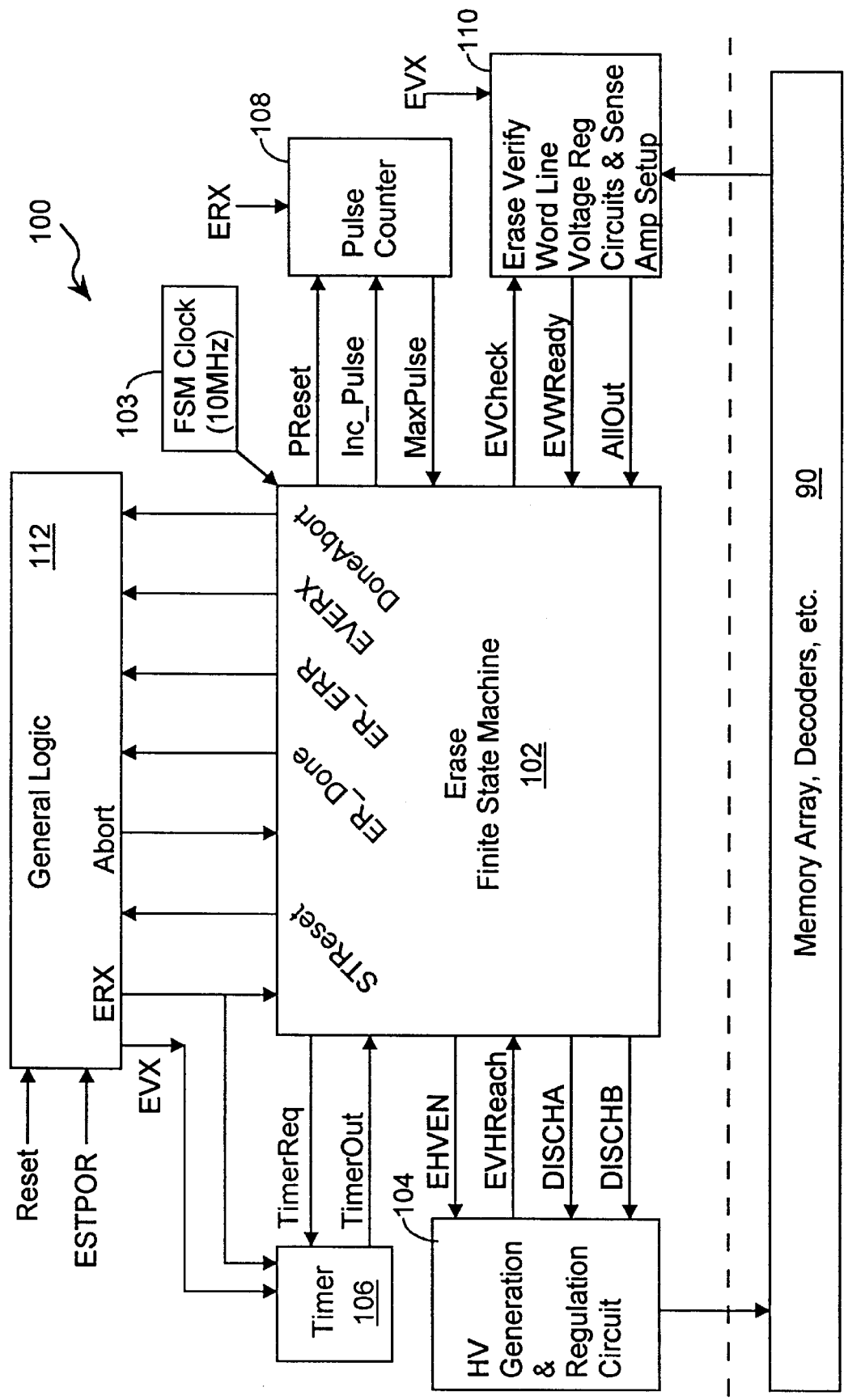
FIG. 1 is a block diagram of the portions of a flash memory device involved in performing memory cell erase operations.

Referring to FIG. 1, there is shown the erase control circuitry 100 for memory cells in a flash memory device. The memory array, address decoders and other portions of the memory device not included in the erase control circuitry are represented in FIG. 1 by reference number 90. An erase finite state machine 102 controls the memory cell erase process. The erase state machine 102 is a synchronous state machine driven by a clock signal from a clock generator 103. In a preferred embodiment the state machine clock runs at approximately 10 MHz, which means the erase state machine 102 makes a state transition approximately once every 100 nanoseconds. Some state transitions cause the state machine to remain at the same state and are represented by short loopback state transition paths in the state transition diagram in FIG. 3. The only asynchronous state transitions used by the state machine are (1) those caused by an externally generated Reset signal, which causes any erase sequence being performed to abort, and (2) a return to the state machine's inactive state (called the START state) whenever the memory device experiences a power on reset.

A high voltage generation and regulation circuit 104 generates the high positive and negative voltages required during the high voltage portion of the erase cycle. A timer circuit 106 is used to time various portions of the erase procedure. A pulse counter 108 is used to count the number of erase cycles that have been used so far to try to erase the memory cells in one sector of the memory array. An erase verify circuit 110 is used to determine whether all the memory cells in the currently selected memory array sector have been fully erased.

Each of these circuits operates in response to control signals generated by the erase state machine 102. Some additional general logic 112 is used to generate some of the control signals required by the erase state machine 102 and supporting circuits.

In a preferred embodiment, a full sector of memory cells are erased simultaneously by the erase function. In a preferred embodiment, the memory device has a 4 megabit flash memory array having 64 sectors. Each sector has 64 rows, each with 1024 cells. The sector that is erased by each erase operation is determined by the signal values on the sector selection address bits (e.g., A17 to A12) during the erase operation. The sector selection address bits must be kept at the same signal values throughout each erase operation. Thus, the sector to be erased is controlled by externally generated address signals.

The ERX (Erase subroutine start) signal input to pulse counter 108 is provided by a command decoder interface. The command decoder interface translates a set of external signals into the ERX signal, subject to user-specified timing. The external signals can be asserted on pins or can be provided from a microcontroller in an embedded environment.

The Reset signal input to general logic block 112 can either be provided from an external pin or from a microcontroller in an embedded environment. Reset is an asynchronous interrupt.

In a stand alone embodiment, the ER_Done and ER_ERR signals are asserted, using a multiplexer, on predefined data I/O pins, such as the $I/O_0$ and $I/O_1$ pins, so that the user is informed when the erase procedure is complete and when it fails. The ER_Done and ER_ERR signals are multiplexed with the standard data lines also coupled to the $I/O_0$ and $I/O_1$ pins. In an embedded environment the ER_Done and ER_ERR signals are coupled directly to a microcontroller. The DoneAbort signal output from erase state machine 102 sets the ER_Done signal.

Figure 2A:
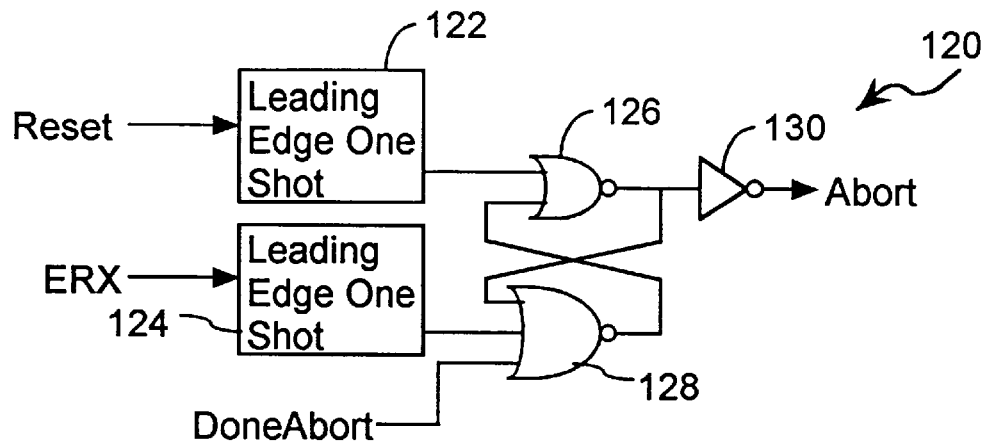
FIGS. 2A, 2B and 2C depict logic circuits that support the erase finite state machine of the preferred embodiment.
Figure 2B:
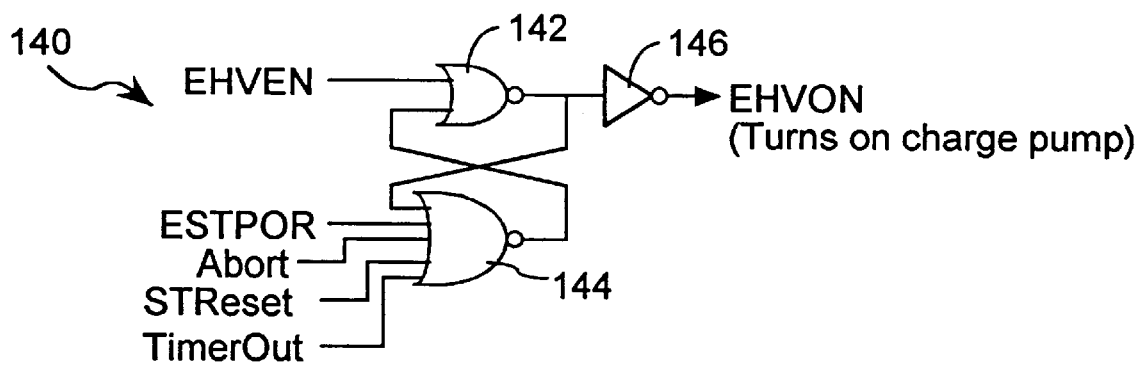
Figure 2C:
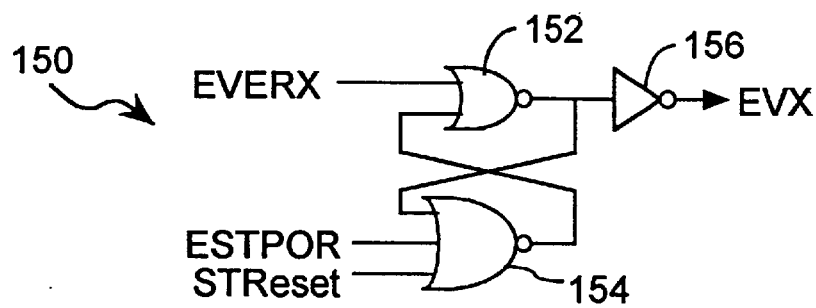

FIGS. 2A, 2B and 2C show some of the circuits included in the general logic block 112 of FIG. 1. Each of these circuits is a latch circuit. The abort logic circuit 120 in FIG. 2A includes two leading edge one shot circuits 122, 124 for converting rising edges of the Reset and ERX (Erase Subroutine Start) signals into short pulse signals.

A pair of cross-coupled NOR gates 126, 128 form a basic latch, and an inverter 130 outputs the Abort signal. An upward (low to high) transition on the Reset signal sets the latch, causing the Abort signal to be set to a logic "1" value. The latch is reset, resetting the Abort signal to a logic "0" value, whenever the DoneAbort signal is equal to logic "1" or the ERX signal has an upward transition.

Referring to FIG. 2B, circuit 140 generates the EHVON signal, which turns on Erase High Voltage when it is set to a logic "1" value. A pair of cross coupled NOR gates 142, 144 form a basic latch, and an inverter 146 outputs the EHVON signal. When the EHVEN (Erase High Voltage Enable) is at a logic "1" value, EHVON is set. When any of the ESTPOR (power on reset), Abort, STReset (state machine reset) or TimerOut signals is at a logic "1" value, EHVON is reset.

Referring to FIG. 2C, the Erase Voltage High Voltage turn on circuit 150 generates the EVX signal, which enables the Erase Verification circuit 110. EVX puts the current sense amplifier 191 (see FIG. 2D) in current-sensing mode while simultaneously coupling all bit lines in a selected sector to the current sense amplifier. EVX also causes a boosted voltage to be applied to the wordline. A pair of cross coupled NOR gates 152, 154 form a basic latch, and an inverter 156 outputs the EVX signal. When the EVERX (begin Erase Verify Start) signal is at a logic "1" value, EVX is set. When either of the ESTPOR (power on reset) and STReset (state machine reset) is at a logic "1" value, EVX is reset to a logic "0" value.

Figure 2D:
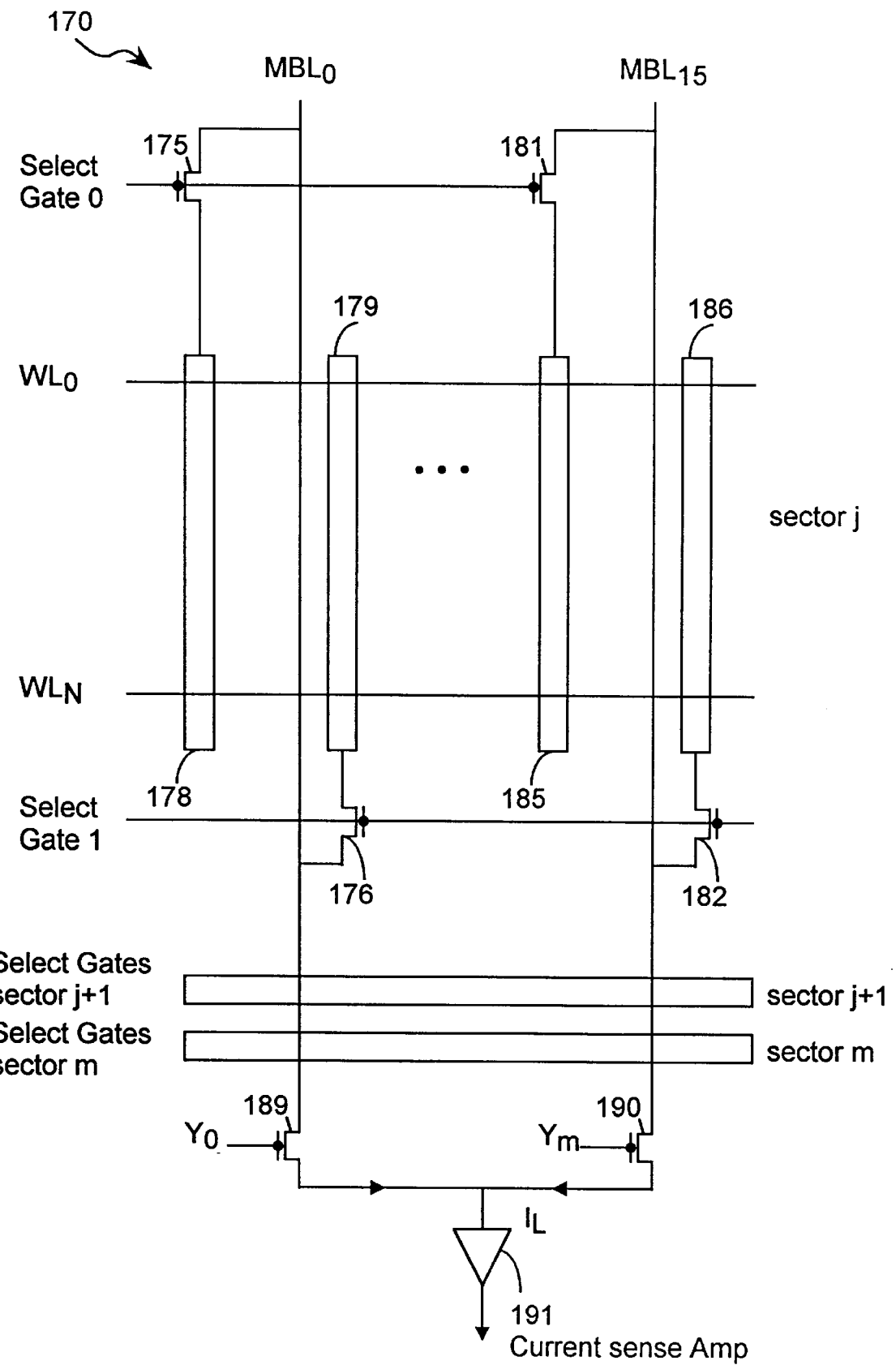
FIG. 2D depicts a sector erase verification circuit used in a preferred embodiment of the present invention.

Referring to FIG. 2D, the sector erase verification circuit works by selecting all the rows and columns in the sector simultaneously and connecting all the bit lines 178, 179, 185, 186 in the sector to a current comparator (also called a current sense amplifier) 191. Erase verify enable transistors 189, 190 and sector select transistors 175, 176, 181, 182 couple the bit lines 178, 179, 185, 186 to the current comparator 191. If all the memory cells in the sector have been fully erased, they will have sufficiently high threshold voltages that all the cells will be turned fully off even when the word line is held at the boosted erase verification voltage. The current comparator is a current mode sense amplifier 191 that compares the total current drawn by all the cells in the selected sector with a current threshold. In a preferred embodiment, the threshold current is set by an internal circuit to about 10 microamps. If the total current drawn by all the cells in the selected sector is less than the threshold current, then it is determined that all the cells in the sector have been fully erased and an AllOut=1 signal is generated. Otherwise, if the total current drawn by all the cells in the sector is more than the threshold current, then it is determined that at least some of the cells in the sector have not been fully erased and an AllOut=0 signal is generated.

Additional information about how all the cells in a sector are simultaneously erased can be found in the patent application entitled "Local Row Decoder and Associated Control Logic for Sector-Erase Fowler-Nordheim Tunneling Based Flash Memory," assigned to the same assignee as the present application, U.S. Ser. No. 09/054,423, Apr. 2, 1998, hereby incorporated by reference as background information.

Erase State Machine

Figure 3:
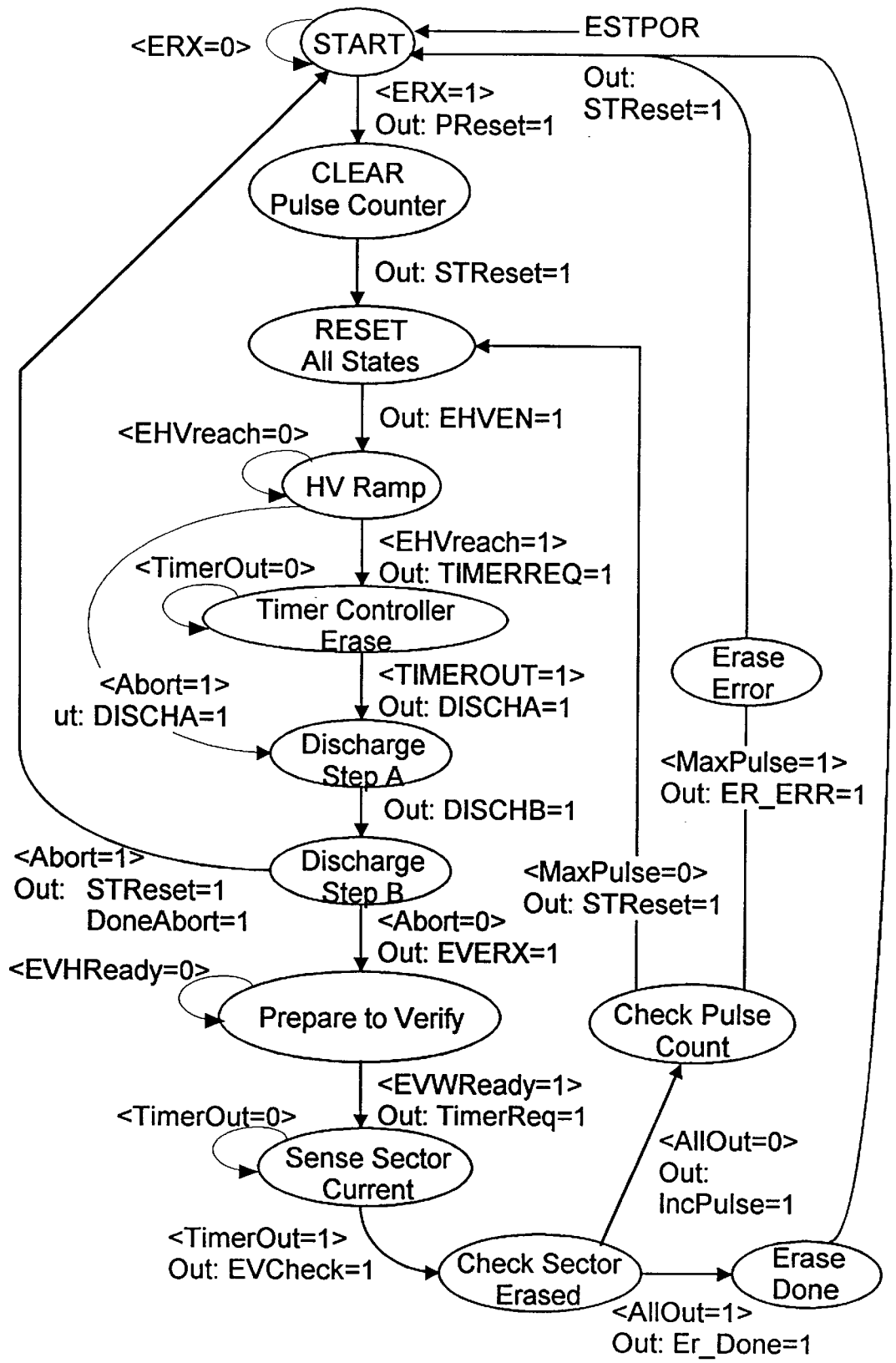
FIG. 3 depicts the state transition diagram of the erase finite state machine in a preferred embodiment of the present invention.

Referring to FIG. 3, the "home" or inactive state of the erase state machine is the START state. When the state machine is inactive, or an erase operation has completed or aborted, or the entire circuit undergoes a power on reset, the state machine returns to the START state.

In the state transition diagrams of FIGS. 3 and 6, signal conditions in pointy brackets, such as "<ERX=1>" indicate the condition for causing a state transition along the path next to the indicated condition. Signals output by the state machine after making a state transition are indicated by the text "Out:".

The ESTPOR (erase state machine power on reset) signal is activated whenever there is a power on reset, returning the state machine to the START state.

An erase cycle begins whenever the ERX signal is set. The trigger that starts the erase state machine in an embedded environment is a combination of command signals from a controller. In a stand alone mode, a command decoder receives external command signals, and when the appropriate signals are received, outputs the ERX signal to start the state machine. The state machine sets the PReset signal to 1 when transitioning from the START to CLEAR states.

In the CLEAR Pulse Counter state the pulse counter 108 (FIG. 1) is reset by the PReset signal, to a predefined beginning value, such as zero. The erase state machine remains in the CLEAR Pulse Counter state for only one state machine clock cycle, and then (on the next clock edge after the PReset signal is activated) the state machine transitions to the "RESET All States" state and sets the STReset signal to 1 while making this transition. The STReset=1 signal turns off the high voltage generation circuitry 104 and erase verification circuitry 110 by resetting the EHVON and EVX signals (see FIGS. 2B and 2C).

From the RESET All States state, the erase state machine transitions to the HV Ramp state and sets the EHVEN signal to "1" on that transition (i.e., clock edge). The EHVEN signal activates the EHVON signal, which then turns on the Erase High Voltage circuitry 104. The erase state machine remains in the HV Ramp state until the High Voltage generation circuit 104 outputs an EHVreach=1 signal to indicate that the charge pump circuitry in the High Voltage generation circuit 104 has generated the high positive voltage (e.g., 10 to 12 volts) and high negative voltage (e.g., −10 volts) needed for performing a sector erase operation. The high positive voltage is applied to all the word lines in the selected sector and the high negative voltage is applied to the source and bulk nodes of all the memory cells in the selected sector.

Once the high voltage generation circuit generates the high voltage needed for erase operations and outputs the EHVreach=1 signal, the erase state machine transitions at the beginning of the next state machine clock cycle to the Timer Controlled Erase state and outputs a TimerReq=1 signal on making that state transition. The TimerReq=1 signal starts the timer circuit 106, which outputs a TimerOut=1 signal when a predefined time period, such as 200 microseconds, expires. The time period determined by the timer circuit 106 defines the duration of the high voltage portion of the memory cell erase cycle. The erase state machine remains in the Timer Controlled Erase state so long as the TimeOut signal is equal to 0.

After the timer circuit outputs a TimeOut=1 signal, the erase state machine transitions at the beginning of the next state machine clock cycle to the Discharge Step A state. After making the transition to the Discharge Step A state, the erase state machine outputs a DISCHA=1 signal, which causes the high voltage generation circuitry 104 to start discharging the previously asserted high positive voltage from all the word lines of the selected sector and the high negative voltage from all the source and bulk nodes of the memory cells in the selected sector.

The erase state machine next transitions from the Discharge Step A state to the Discharge Step B state, outputting a DISCHB=1 signal after making that transition. The high voltage generation circuitry 104 continues discharging high voltages from circuit nodes while in the Discharge Step B state. Whenever an Abort=1 signal is generated, in response to an externally generated Reset signal, if the erase state machine is in the midst of an erase operation, corresponding to the HV Ramp and Timer Controller Erase states, the state machine immediately (i.e., asynchronously) transitions to the Discharge Step A state. Since the asynchronous transition to the Discharge Step A state caused by an abort could happen very close (e.g., within a few nanoseconds) of the beginning of next state clock cycle, the erase state machine might be in the Discharge Step A state an insufficient period of time to discharge all the high voltage internal nodes. For this reason two Discharge states are provided. By providing the Discharge Step B state, it is ensured that the high voltage generation circuit will have at least one full state machine clock cycle to discharge the high voltage circuit nodes at the end of an aborted erase operation.

After discharging high voltage nodes in the Discharge Step A and Discharge Step B states, the erase state machine transitions to the START state if an abort occurred, as indicated by the Abort signal being equal to 1. Upon transitioning to the START state, the state machine generates STReset=1 and DoneAbort=1 signals. The STReset=1 signal turns off all erase circuitry and the DoneAbort=1 signal resets the Abort signal back to a value of 0 (see FIG. 2A).

Otherwise, if an abort did not occur, after discharging high voltage nodes in the Discharge Step A and Discharge Step B states, the erase state machine transitions to the Prepare to Verify state. After making this state transition the state machine outputs an EVERX=1 signal, which causes the Erase Verify circuit to prepare for erase verification by asserting a boosted voltage (i.e., a voltage higher than the Vcc voltage, such as 4.6 volts when Vcc is equal to 3.3 volts) on all the word lines in the entire memory sector being erased. The Erase Verify circuit outputs an EVWReady=1 signal once all the word lines in the sector have been brought up to the boosted voltage.

The erase state machine remains in the Prepare to Verify state until the Erase Verify circuit outputs the EVWReady=1 signal, after which it transitions at the beginning of next state machine clock cycle to the Sense Sector Current state. On making the transition to the Sector Sense Current state the state machine outputs a TimerReq=1 signal, which resets the TimerOut signal back to a 0 value and reactivates the timer circuit 106. Since the EVX signal is active (it was activated by the EVERX=1 signal), the timer circuit 106 generates a TimerOut=1 signal after an appropriate erase verification current sensing period, typically between two and five microseconds in duration. The erase state machine remains in the Sense Sector Current state until the timer circuit generates the TimerOut=1 signal.

After the timer circuit outputs a TimeOut=1 signal, the erase state machine transitions at the beginning of the next state machine clock cycle to the Check Sector Erase state and outputs an EVCheck=1 signal. The EVCheck=1 signal causes the erase verification circuit to latch the current comparison Result signal generated by the sector current sense circuit and to output a corresponding AllOut signal. The AllOut signal is set equal to 1 by the erase verification circuit if all cells in the sector have been fully erased, and is set equal to 0 if at least some cells in the sector require additional erasing.

After one state machine clock cycle in the Check Sector Erased state, if AllOut is equal to 1 (indicating that all cells in the sector have been fully erased) the erase state machine transitions to the Erase Done state and outputs an ER_Done=1 signal. The ER_Done signal is asserted on a predefined data I/O pin, such as the I/O$_0$ pin, thereby informing the end user, or an electronic device that is using the memory device, that the specified sector has been fully erased. Alternatively, the ER_Done signal can be interfaced to a controller to indicate the completion of the erase operation.

From the Erase Done state the erase state machine transitions back to the START state, and outputs a STReset=1 signal to ensure that the high voltage and erase verification circuitry are turned off.

Otherwise, if AllOut is equal to 0 (indicating that at least some cells in the sector require additional erasing), the erase state machine transitions from the Check Sector Erase state to the Check Pulse Count state and outputs an Inc_Pulse=1 signal, which causes the pulse counter 108 to increment its pulse count. Thus, the pulse counter is incremented at the end of each erase cycle, unless all the memory cells in the selected sector have been fully erased, in which case the pulse counter is cleared.

In the Check Pulse Count state the erase state machine checks the MaxPulse signal generated by the pulse counter. If MaxPulse is equal to 1, that indicates the pulse counter has already reached its maximum count value, and the state machine transitions to the Erase Error state and outputs an ER_ERR=1 signal. The ER_ERR=1 signal indicates that the erase circuitry failed to fully erase all the cells in the currently selected sector. The maximum count value is either a fixed or programmable value that defines the maximum number of erase cycles a sector should be subjected to. If all the cells in the sector are not fully erased after that many erase cycles, the memory device has probably suffered a memory cell or other circuitry failure. From the Erase Error state, the erase state machine transitions back to the START state, and outputs a STReset=1 signal to ensure that the high voltage and erase verification circuitry are turned off.

From the Check Pulse Count state, if MaxPulse is equal to 0, indicating that the pulse counter has not yet reached its maximum count value, the state machine transitions to the RESET All States state, and outputs a STReset=1 signal to ensure that the high voltage and erase verification circuitry are turned off. The sector erase cycle is then repeated, as described above.

Flash Memory Array Page Program Circuitry

Figure 4:
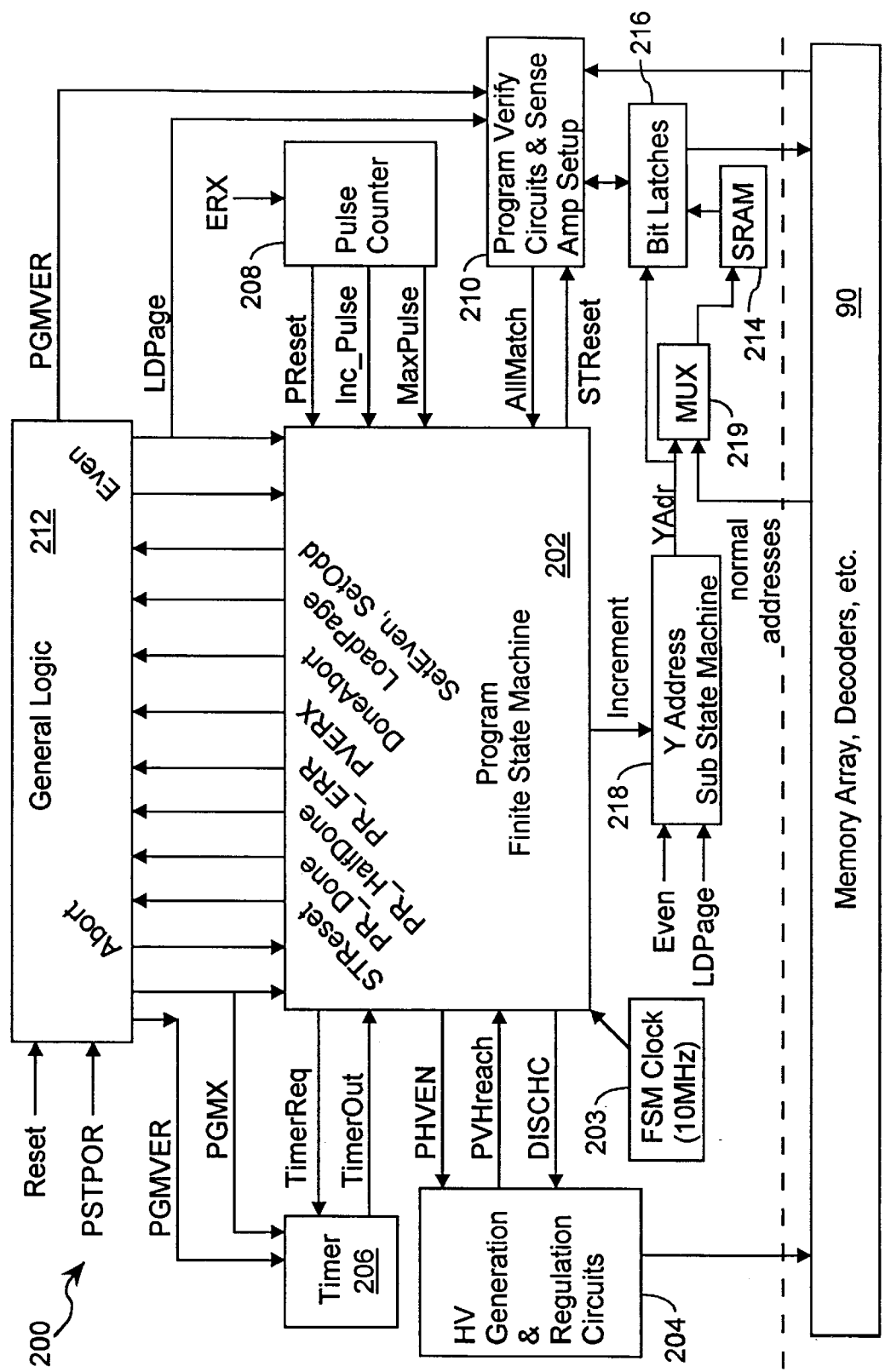
FIG. 4 is a block diagram of the portions of a flash memory device involved in performing memory cell program operations.

Referring to FIG. 4, there is shown the program control circuitry 200 for memory cells in a flash memory device. The memory array, address decoders and other portions of the memory device not included in the erase control circuitry are represented in FIG. 4 by reference number 90. A program finite state machine 202 controls the memory cell programming process. The state machine 202 is a synchronous state machine driven by a clock signal from a clock generator 203. In a preferred embodiment the state machine clock runs at approximately 10 MHZ, which means the program state machine 202 makes a state transition approximately once every 100 nanoseconds. Some state transitions cause the state machine to remain at the same state and are represented by short loopback state transition paths in the state transition diagram in FIG. 7. The only asynchronous state transitions used by the state machine are (1) those caused by an externally generated Reset signal, which causes any program sequence being performed to abort, and (2) a return to the state machine's inactive state (called the START state) whenever the memory device experiences a power on reset.

A high voltage generation and regulation circuit 204 generates the high negative voltages and the boosted Vcc+ voltage required during the high voltage portion of the program cycle. A timer circuit 206 is used to time various portions of the program procedure. A pulse counter 208 is used to count the number of program cycles that have been used so far to try to program the memory cells in one partial page of the memory array. A program verify circuit 210 is used to determine whether the memory cells in a currently selected partial page of the memory array have been fully programmed.

The program state machine 202 generates "page portion tracking" signals that keep track of which portion of the selected page (e.g., the even columns or the odd columns) is currently being programmed, and then loads the program data for the corresponding memory cells from an on-chip SRAM 214 into the programming bit latches 216. The selected page portion is then programmed, once again in accordance with the generated page portion tracking signals. In a preferred embodiment described below, the page portion tracking signals are called the "Even" and "Odd" signals.

An SRAM page memory 214 is used to store the programming data for a full page (1024 bits). The SRAM page memory 214 is not located in the main memory array, rather it is implemented as a separate memory array (i.e., separate from the array of flash memory cells) located in the memory device's periphery.

In addition, the memory device of the present invention includes a half page (e.g., 512) of programming bit latches 216, one for every two columns (i.e., bit lines). The programming bit latches 216 are located inside the main flash memory cell array 90, where circuit layout area is at a premium. To save space, just one programming bit latch is provided for every two adjacent columns, thereby making the space constraints (associated with being positioned inside the main flash memory array, which utilizes an extremely compact circuit layout) on the programming bit latches 216 less severe. Two bit line access transistors are provided for each programming bit latch, one enabled by an "Even" column selection signal and the other enabled by an "Odd" column selection signal.

Figure 5A:
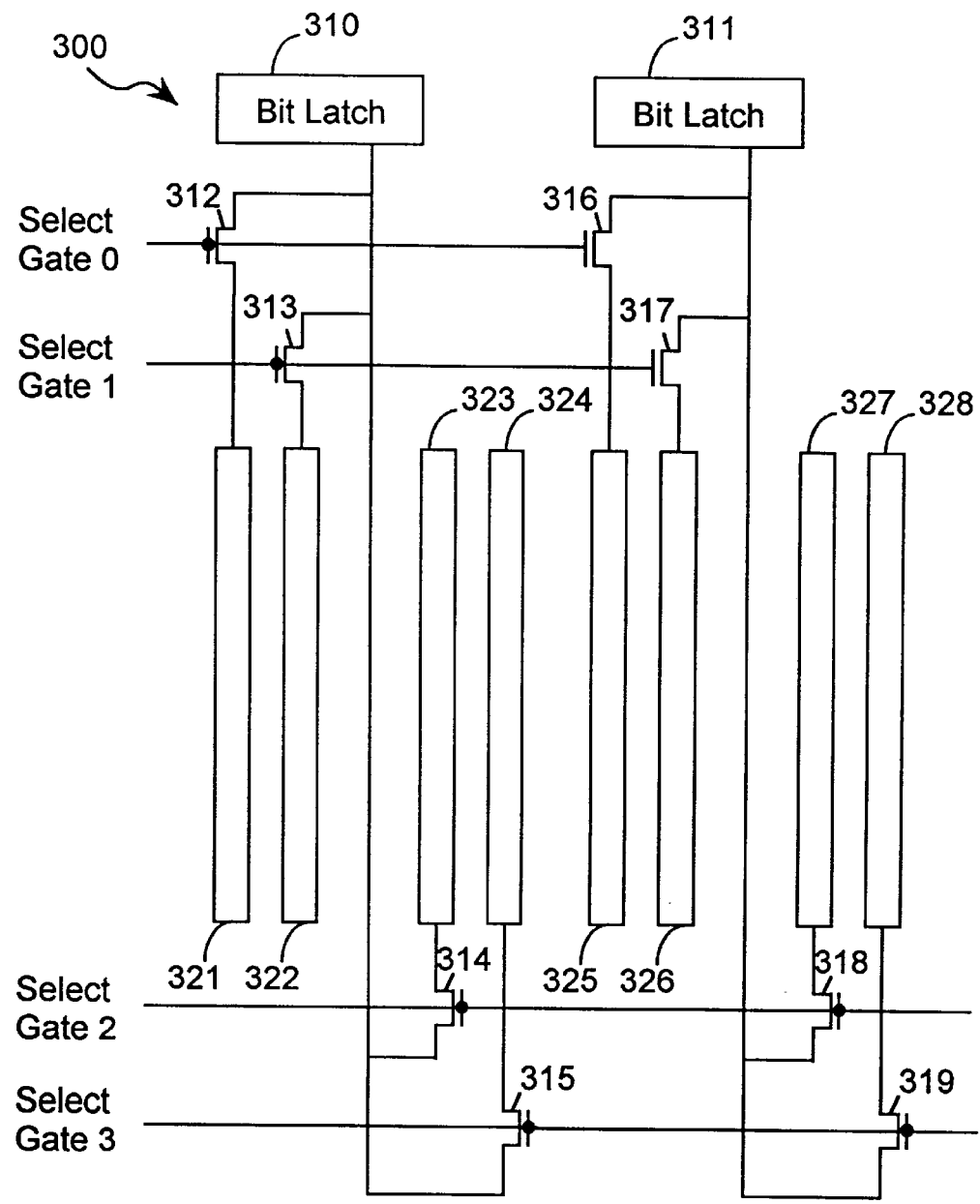
FIGS. 5A and 5B depict memory cell arrays with programming bit latches according to the present invention.
Figure 5B:
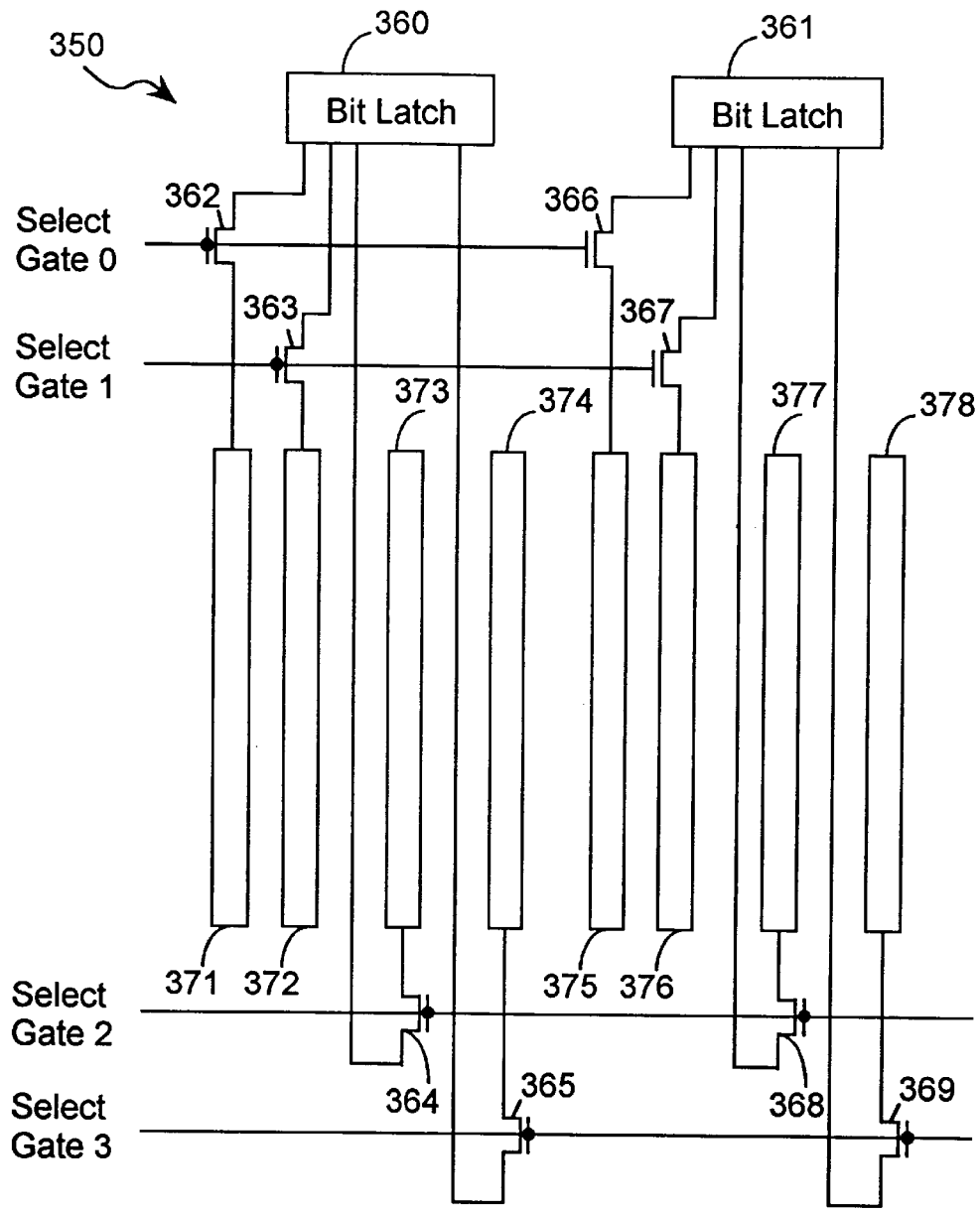

Referring to FIG. 5A, in an alternate embodiment, one programming bit latch 310, 311 is provided for every four columns 321–324, 325–328, with four access transistors 312–315, 316–319 for selectively coupling the latch to each of four adjacent memory cell columns. FIG. 5B illustrates another alternative embodiment where four separate bit lines and four access transistors 362–365, 366–369 couple four adjacent memory cell columns to the respective bit latch 360, 361. More generally, the program state machine enables the use of $N/2^k$ programming bit latches in the memory array, instead of a full set of N programming bit latches, where N is the number of columns in the memory array and k is a integer greater than zero. In a further alternative embodiment, one programming bit latch can be provided for each 3, 4, 5, ... or N columns, with a corresponding number of access transistors being used to selectively couple the latch to adjacent bit lines. These alternate embodiments further reduce the space constraints on the programming bit latches, and further do not increase the amount of time required to program the flash memory cells. Only minor adjustments to the program state machine are required to work with these alternate implementations of the programming bit latches.

Referring to FIG. 4, a "sub-state machine" 218 is used to generate a sequence of Y address signals, so as to sequentially access the programming bit latches 216, eight, sixteen, thirty-two, sixty-four or 128 bits at a time, and the corresponding entries in the SRAM 214. In particular, in a preferred embodiment, sixteen bits of data are loaded from the SRAM into the bit latches 216 at a time. The byte address for the bit latches to be loaded and the SRAM locations to be copied are generated by the sub-state machine 218. The sub-state machine, once activated, generates thirty-two sequential byte location addresses during sequential state machine cycles for loading a total of 512 values into the bit latches, sixteen bits at a time. As data in the SRAM 214 is accessed, it is loaded into the respective locations in the bit latches 216.

A multiplexer 219 communicates either the Y addresses generated by the sub-state machine 218, or the normal Y addresses from the memory array's address decoders, to the SRAM 214. The sub-state machine generated YAdr values are connected directly to the bit latches.

The sub-state machine 218 is also used to sequentially access each of the bytes in the bit latches 216 after a memory cell programming cycle, to determine if the memory cells assigned "0" data values have been fully programmed. A memory cell assigned a "0" data value is fully programmed when its threshold voltage is sufficiently low to ensure that it will be read as a zero during worst case power supply voltage and temperature conditions. Erased cells that have not been programmed are read as "1" data value memory cells.

Each of the "supporting" circuits used to program flash memory cells operates in response to control signals generated by the program state machine 202. Some additional general logic 212 is used to generate additional control signals required by the program state machine 202 and supporting circuits.

The PGMX (Program start) signal input to program state machine 202 and timer 206 is provided by a command decoder interface. The command decoder interface translates a set of external signals into the PGMX signal, subject to user-specified timing. The external signals can be asserted on pins or can be provided from a microcontroller in an embedded environment.

The Reset signal input to general logic block 212 can either be provided from an external pin or from a microcontroller in an embedded environment. Reset is an asynchronous interrupt.

In a stand alone embodiment, the PR_Done and PR_ERR signals are asserted on output pins so that the user is informed when the program procedure is complete and when it fails. The PR_Done and PR_ERR signals can be assigned to arbitrary I/O pins using a multiplexer to couple the control signals and the standard data lines to the I/O pins. In an embedded environment the PR_Done and PR_ERR signals are coupled directly to a microcontroller. The Done-Abort signal output from program state machine 202 sets the PR_Done signal.

In a preferred embodiment, one "page" of memory cells, consisting of all the memory cells having the same row address within a memory array sector, are programmed each time the program state machine is activated. In a preferred embodiment, the memory device has a 4 megabit flash memory array having 64 sectors. Each sector has 64 rows or "pages," and each page has 1024 memory cells. The page that is programmed by each program operation is determined by the signal values on the sector select and page select address bits (e.g., A17 to A12 and A11 to A6) during the programming operation. These address bits must be kept at the same signal values throughout each programming operation. Thus, the page to be programmed is controlled by externally generated address signals.

Further, the data values to be programmed into a page of the flash memory array are loaded into the SRAM 214 prior to activation of the program state machine by applying a predefined voltage pattern on a particular I/O pin of the memory device to put the device into the proper state for loading data into the SRAM, and then asserting the data to be loaded into the SRAM on the device's data I/O pins while applying a predefined set of address signals.

Further details of the operation of the SRAM 214, bit latches 216 and the program verify circuits 210 can be found in the patent application entitled "Architecture and Method for Performing Page WriteNerify in a Flash Memory Chip," assigned to the same assignee as the present application, U.S. Ser. No. 09/108,759, filed Jul. 1, 1998, hereby incorporated by reference as background information.

General Logic Circuits Supporting Program Finite State Machine

FIGS. 6A, 6B, 6C and 6D show some of the circuits included in the general logic block 212 of FIG. 4. Each of these circuits is a latch circuit. The Even/Odd logic circuit 220 in FIG. 6A includes a pair of cross coupled NOR gates 222, 224 that form a basic latch, and a pair of inverters 226, 228 on the outputs of the NOR gates. The SetEven signal, when activated to a logic value of 1 sets the Even signal, from inverter 226, to a logic value of 1 and the Odd signal output by inverter 228 to a logic value of 0. The SetOdd signal, when activated to a logic value of 1 sets the Odd signal, from inverter 228, to a logic value of 1 and the Even signal output by inverter 226 to a logic value of 0.

Figure 6A:
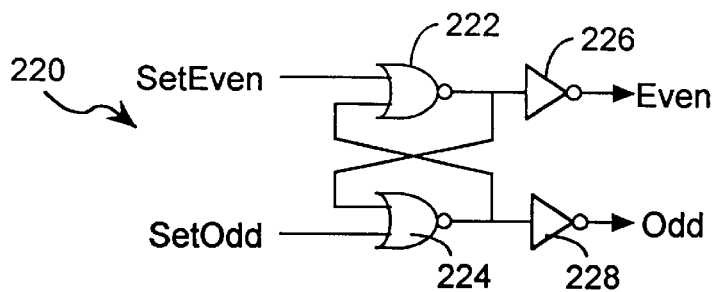
FIGS. 6A, 6B, 6C, 6D and 6E depict logic circuits that support the program finite state machine of the preferred embodiment.
Figure 6B:
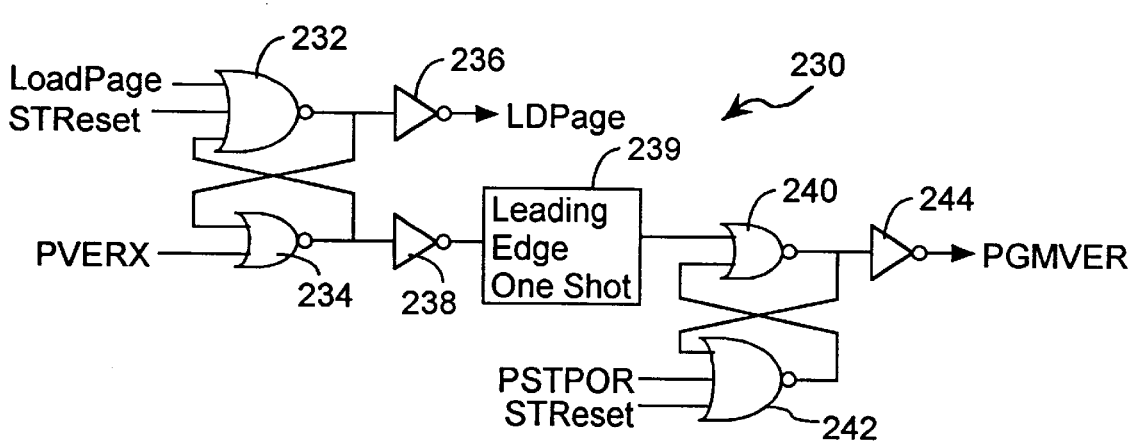

Referring to FIG. 6B, the PGMVER logic circuit 230 includes a first latch consisting of two cross coupled NOR gates 232, 234 and a pair of inverters 236, 238 on the outputs of the NOR gates. The LDPage signal is activated to a logic value of 1 when either the LoadPage signal or STReset signal have a logic value of 1 and is reset to a logic value of 0 by the PVERX signal. A leading edge one shot circuit 239, coupled to the output of inverter 238, generates a pulse whenever LDPage is reset to a logic value of 0. Another latch, consisting of a pair of cross coupled NOR gates 240, 242 and an inverter 244 coupled to the output of NOR gate 240, generates a stable PGMVER=1 signal whenever LDPage is reset (which causes the leading edge one shot 239 to generate a pulse that sets the latch 240–242). The PGMVER signal is reset to a logic value of 0 whenever either the PSTPOR power on reset signal or the STReset signal is activated to a logic value of 1. The LDPage signal is used to enable the sub-state machine 218 to load a half page of data from the SRAM page memory 214 into the programming bit latches 216. The PGMVER signal is used to enable the programming verification circuitry 210.

Figure 6C:
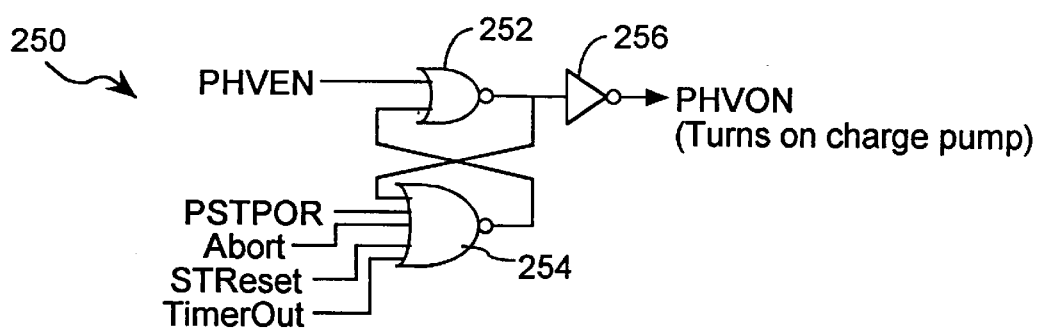

Referring to FIG. 6C, a latch 250 consisting of two cross coupled NOR gates 252, 254 and an inverter 256 coupled to the output of NOR gate 252 generates the PHVON signal, which turns on the charge pump for generating the high negative voltage used on the gates and the boosted Vcc+ voltage used on the drains of the memory cells being programmed to 0 data values. The PHVON signal is activated to a logic value of 1 by the PHVEN enable signal, and is reset to a logic value of 0 by any of the PSTPOR, Abort, STReset and TimerOut signals.

Figure 6D:
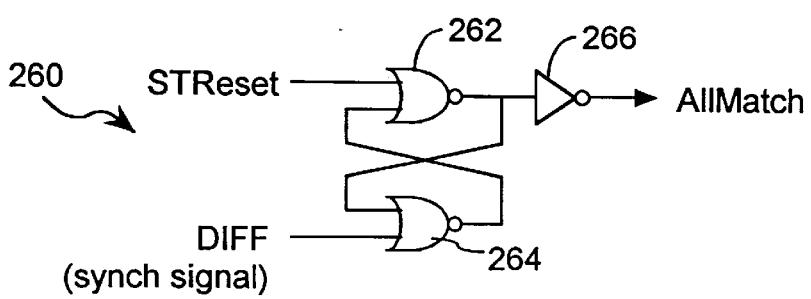

Referring to FIG. 6D, a latch 260 consisting of two cross coupled NOR gates 262, 264 and an inverter 266 coupled to the output of NOR gate 262 generates the AllMaytch signal. The AllMatch signal is activated to a logic value of 1 by the STReset=1 signal, and is reset to a logic zero value whenever the program verification circuitry 210 detects a difference between the data stored in a set of memory cells being programmed and the corresponding data in the bit latches. The program verification circuitry generates a DIFF=1 signal (not shown in the figures) whenever such a difference is detected during the program verification portion of the memory cell programming operation.

Figure 6E:
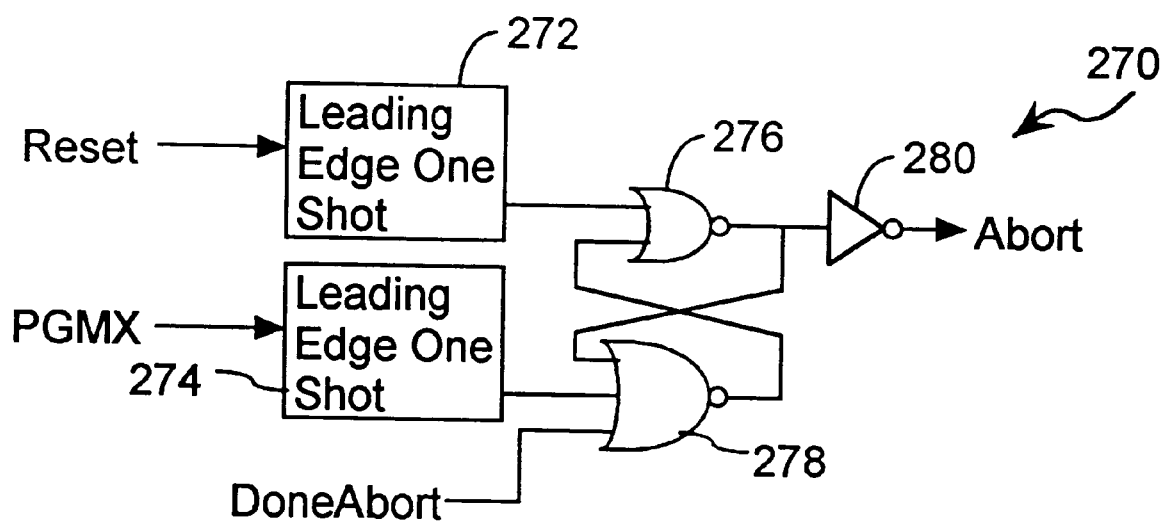

Referring to FIG. 6E, the general logic 212 for the program state machine also includes an abort logic circuit 270. The abort logic circuit includes two leading edge one shot circuits 272, 274 for converting rising edges of the Reset and PGMX (program start) signals into short pulse signals. A pair of cross coupled NOR gates 276, 278 form a basic latch, and an inverter 280 outputs the Abort signal. An upward (low to high) transition on the Reset signal sets the latch, causing the Abort signal to be set to a logic "1" value. The latch is reset, resetting the Abort signal to a logic "0" value, whenever the DoneAbort signal is equal to logic "1" or the PGMX signal has an upward transition.

Program State Machine

Figure 7:
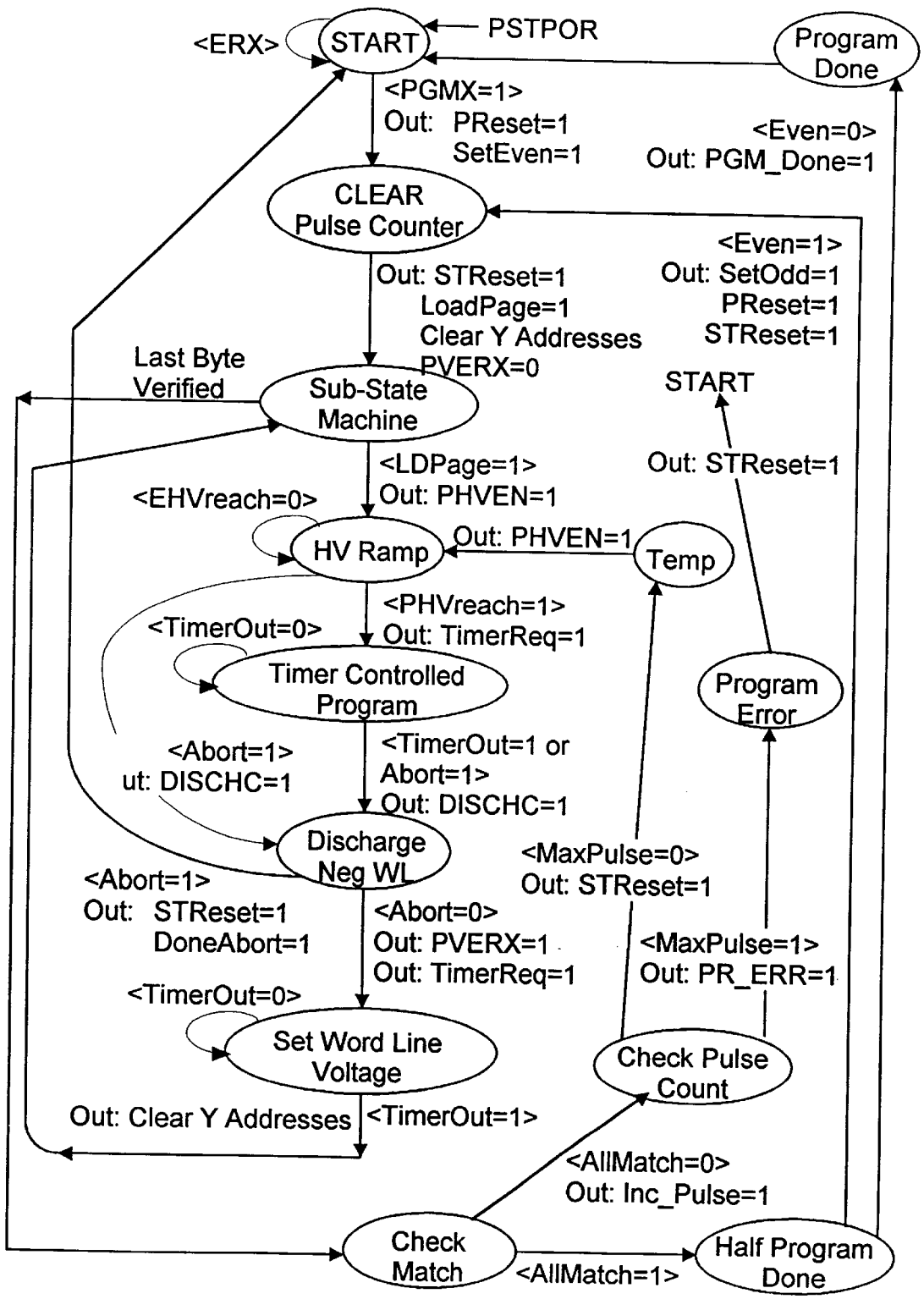
FIG. 7 depicts the state transition diagram of the erase finite state machine in a preferred embodiment of the present invention.

Referring to FIG. 7, the "home" state of the program state machine is the START state. When the program state machine is inactive, or a program operation has completed or aborted, or the entire circuit undergoes a power on reset, the program state machine returns to the START state.

In the state transition diagram of FIG. 7, signal conditions indicated in pointy brackets, such as "<PGMX=1>" indicate the condition for causing a state transition along the path next to the indicated condition. Signals output by the state machine after making a state transition are indicated by the text "Out:". The state machine transitions on clock edges when inputs in pointy brackets are set to '1.' In cases when no such input is indicated, the state machine transitions on the next clock edge.

The PSTPOR (program state machine power on reset) signal is activated whenever there is a power on reset, returning the state machine to the START state.

A program cycle begins whenever the PGMX signal is set. The trigger that starts the program state machine in an embedded environment is a combination of command signals from a controller. In a stand alone mode, a command decoder receives external command signals, and when the appropriate signals are received, outputs the PGMX signal to start the state machine.

The program state machine sets the PReset and SetEven signals to 1 when transitioning from the START to CLEAR states. The PReset signal resets the pulse counter 208 (see FIG. 4) to a predefined beginning value, such as zero. The SetEven signal activates the Even signal, which in turn indicates that the "even" half of the memory cells in the currently selected page are the cells to be programmed next.

In the CLEAR Pulse Counter state the pulse counter 108 (FIG. 1) is reset by the PReset signal. The program state machine remains in the CLEAR Pulse Counter state for only one state machine clock cycle, and then transitions to the "Sub-State Machine" state. Upon transitioning to the Sub-State Machine state, the STReset and LoadPage signals are activated, the Y address register in the sub-state machine 218 is cleared. Also, it is noted that the PVERX signal was previously reset to a logic 0 value by the STReset=1 signal. Since the LoadPage signal is active and the PVERX signal is equal to 0, the sub-state machine will load data from the SRAM 214 into the bit latches 216. Furthermore, whichever one of the "Even" and "Odd" signals is active is used by the sub-state machine to determine which data values (i.e., either those for even Y addresses or odd Y addresses) to load from the SRAM 214 into the bit latches 216.

In the Sub-State Machine state, the sub-state machine 218 generates a sequence of thirty-two Y address values and loads 512 bits (i.e., sixty-four bytes) of data into the bit latches. When the sub-state machine completes this task, the program state machine transitions to the HV Ramp state, on which transition it outputs a PHVEN=1 signal.

The PHVEN signal activates the PHVON signal, which then turns on the Program High Voltage circuitry 204. The program state machine remains in the HV Ramp state until the Program High Voltage generation circuit 204 outputs a PHVreach=1 signal to indicate that the charge pump circuitry in the High Voltage generation circuit 104 has generated the high negative voltage (e.g., −10 volts) and boosted Vcc+ voltage (e.g., +5 volts) needed for performing a program operation.

Once the high voltage generation circuit generates the high negative voltage and boosted Vcc+ voltage needed for program operations and outputs the PHVReach=1 signal, the program state machine transitions at the beginning of the next state machine clock cycle to the Timer Controlled Program state and outputs a TimerReq=1 signal after making that state transition. The TimerReq=1 signal starts the timer circuit 206, which outputs a TimerOut=1 signal when a predefined time period, such as 100 microseconds, expires. The time period determined by the timer circuit 206 defines the duration of the high voltage portion of the memory cell program cycle. The program state machine remains in the Timer Controlled Program state so long as the TimeOut signal is equal to 0.

After the timer circuit outputs a TimeOut=1 signal, the program state machine transitions at the beginning of the next state machine clock cycle to the Discharge Negative Word Line (Discharge Neg WL) state. After making the transition to the Discharge Negative Word Lines state, the program state machine outputs a DISCHC=1 signal, which causes the high voltage generation circuitry 204 to start discharging the selected word line of the memory array from a high negative voltage back to the circuit ground voltage.

Whenever an Abort=1 signal is generated, in response to an externally generated Reset signal, if the program state machine is in the midst of a programming operation, corresponding to the HV Ramp and Timer Controller Program states, the program state machine will immediately (i.e., asynchronously) transition to the Discharge Negative Word Line state and the DISCHC signal is activated. At the next state clock cycle after the Abort signal becomes active, the program state machine transitions back to the START state and the STReset and DoneAbort signals are activated. The STReset=1 signal turns off all program circuitry and the DoneAbort=1 signal resets the Abort signal back to a value of 0 (see FIG. 6E). Any remaining high negative voltage on the previously selected word line continues to discharge back to the circuit ground after the state machine transitions to the START state.

When a program operation is not aborted, after one state machine clock cycle in the Discharge Negative Word Line state the program state machine transitions to the Set Word Line Voltage state, outputting PVERX=1 and TimerReq=1 signals after making that transition. The PVERX=1 signal enables the program verification circuit. During the Set Word Line Voltage state the selected word line's voltage is raised to an intermediate positive voltage, typically between 0.5 Vcc and 0.75 Vcc (e.g., 2.2 volts when Vcc is equal to 3.3 volts). The TimerReq=1 signal starts the timer circuit so as to measure an appropriate period of time (e.g., 1 to 2 microseconds) for bringing the voltage of the selected word line to the intermediate voltage.

After setting the word line to the intermediate voltage in the Set Word Line Voltage state, the termination of which is marked by expiration of the time period being measured by the timer circuit and generation of the TimerOut=1 signal, the program state machine transitions to the Sub-State Machine state. When the sub-state machine is called with PVERX=1, the sub-state machine checks to see if all the bits in the partial page currently being programmed to a data value of 0 have been fully programmed. If not, the sub-state machine generates a "DIFF=1" signal, which resets the AllMatch signal to a logic value of 0.

More specifically, the sub-state machine generates the same sequence of thirty-two Y addresses as when data values are copied into the programming bit latches, but this time it reads the corresponding memory locations in the page being programmed and compares the data values read with the data values in the addressed bit latches. Each memory cell that is either not being programmed (because it has been assigned a data value of 1) or that has not been fully programmed will be read as a data value of 1. Each memory cell that is read as having a data value of zero is fully programmed. Sometimes, some memory cells in a page are programmed more quickly than others, due to materials variations across the memory device. To avoid "over programming" of the cells that are already fully programmed, the sub-state machine stores a "1" value in the bit latch for each memory cell read by the sub-state machine as having a "0" value, thereby preventing any further programming of those memory cells. Furthermore, during each sub-cycle of the sub-state machine, while the sub-state machine reads the sixteen memory cell bits corresponding to the current Y address generated by the sub-state machine, if any programming bit latch for the currently addressed bit latches that stores a 0 value is not matched by the data read from the corresponding memory cell, then a "DIFF" signal is generated by the sub-state machine, which resets the AllMatch signal to a logic value of 0. Stated mathematically:

If, for any i=0 to 15, BitLatch(YAdr+i)=0 AND MemoryCell(YAdr+i)=1),
   Then DIFF=1;
Else
   DIFF=0;

where YAdr+i are the addresses of all the programming bit latches and memory cells being addressed by the sub-state machine at any one time.

After the sub-state machine has cycled through all the Y addresses, and has attempted to verify the programming of all the even or odd memory cells in the page being programmed, the state machine transitions to the Check Match state. In the Check Match state, if AllMatch is equal to 0, that means that at least one memory cell corresponding to the partial page data currently stored in the bit latches has not yet been fully programmed. As a result, if AllMatch is equal to 1, the program state machine transitions back to the Check Pulse Count state. Upon making this transition, the program state machine generates an Inc_Pulse=1 signal, which increments the pulse count maintained by the pulse counter 208. Thus, the pulse counter is incremented at the end of each programming cycle, unless all the memory cells assigned a data value of 0 have been fully programmed, in which case the pulse counter is cleared.

In the Check Pulse Count state the program state machine checks the MaxPulse signal generated by the pulse counter 208. If MaxPulse is equal to 1, that indicates the pulse counter has already reached its maximum count value, and the state machine transitions to the Program Error state and outputs a PR_ERR=1 signal. The PR_ERR=1 signal indicates that the program circuitry failed to fully program all the cells assigned a 0 data value in the currently selected page. The maximum count value is either a fixed or programmable value that defines the maximum number of program cycles any memory cell should be subjected to. If all the cells assigned 0 data values in a partial page are not fully programmed after that many program cycles, the memory device has probably suffered a memory cell or other circuitry failure. From the Program Error state, the program state machine transitions back to the START state, and outputs a STReset=1 signal to ensure that the high voltage and program verification circuitry are turned off.

If, when the program state machine is in the Check Pulse Count state, MaxPulse is equal to 0, that indicates the program state machine needs to try again to program the memory cells in the partial page currently being programmed. As a result, the program state machine transitions to the Temp state, generating an STReset=1 signal after this state transition. It then transitions back to the HV Ramp state, generating a PHVEN=1 signal upon reaching the HV Ramp state, thereby restarting the partial page programming process.

Returning to consideration of the Check Match state, if AllMatch is equal to 1, that means that the partial page of data currently stored in the bit latches has been fully programmed into the corresponding memory cells, and therefore the state machine transitions to the Half Program Done state.

From the Half Program Done state the state machine transitions back to the CLEAR Pulse Counter state if the Even signal is equal to 1, because half the selected page remains to be programmed. After transitioning to the CLEAR Pulse Counter state the SetOdd and PReset signals are set to logic 1 values. The SetOdd signal causes the Odd signal to set to a logic 1 value and the Even signal to be set to a logic 0 value (see FIG. 6A). The entire programming procedure is then repeated, but for the memory cells in the selected page that are on the odd numbered columns (i.e., bit lines).

From the Half Program Done state the state machine transitions back to the Program Done state if the Even signal is equal to 0, because that means both halves of the selected page have been successfully programmed. Upon completing the transition to the Program Done state, the program state machine generates a PGM_Done=1 signal. The PGM_Done signal is asserted on a predefined data I/O pin, such as the $I/O_0$ pin, thereby informing the end user, or the electronic device being used to program the memory device, that the specified page has been fully programmed with the data previously stored in the SRAM. Alternatively, the PGM_Done signal can be interfaced to a controller to indicate the program operation is complete.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. Apparatus, for use in conjunction with a non-volatile memory array having a plurality of sectors, each sector having a plurality of source and bulk nodes, the apparatus for erasing data from the memory array, the apparatus comprising:

a high voltage generation circuit for generating first and second high voltages;

an erase verify circuit for determining whether memory cells in a selected memory array sector have been fully erased; and an erase finite state machine, coupled to the high voltage generation circuit and the erase verify circuit, the state machine for controlling erasure of the data stored in the memory array, the state machine having a plurality of states including:

a high voltage state for applying the first high voltage to a plurality of word lines in a selected sector of the memory array, and for applying the second high voltage to a plurality of the source and bulk nodes in the selected sector of the memory array;

a first discharge state for discharging of the plurality of word lines and the plurality of source and bulk nodes, the state machine transitions to the first discharge state whenever an abort signal is generated, and the state machine transitions to the first discharge state after the high voltage state;

a second discharge state for discharging of the plurality of word lines and the plurality of source and bulk nodes, the state machine transitions to the second discharge state after the first discharge state; and a verification state for verifying that all cells in selected the sector have been erased, the state machine transitions to the verification state after the second discharge state when a first control signal is in a first logic state.

2. The apparatus of claim 1 wherein the state machine asynchronously transitions to the first discharge state whenever an abort signal is generated.

3. The apparatus of claim 2 wherein the verification state further comprises a sense sector current state for checking current drawn by all cells in the selected sector simultaneously to verify all of the cells have been fully erased.

4. The apparatus of claim 3 wherein the verification state further comprises a check pulse count state for outputting an erase error signal when a predetermined maximum number of erase cycles have been performed without fully erasing all cells in the selected sector.

5. Apparatus, for use in conjunction with a non-volatile memory array having a plurality of sectors, each sector having a plurality of source and bulk nodes, the apparatus for erasing data from the memory array, the apparatus comprising:

a high voltage generation circuit for generating first and second high voltages;

an erase verify circuit for determining whether memory cells in a selected memory array sector have been fully erased; and an erase finite state machine, coupled to the high voltage generation circuit and the erase verify circuit, the state machine for controlling erasure of the data stored in the memory array, the state machine having a plurality of states including:

a high voltage state for applying the first high voltage to a plurality of word lines in a selected sector of the memory array, and for applying the second high voltage to a plurality of source and bulk nodes in the selected sector of the memory array;

at least one discharge state for discharging of the plurality of word lines and the plurality of source and bulk nodes, the state machine asynchronously transitions to the at least one discharge state whenever an abort signal is generated, and the state machine transitions to the at least one discharge state after the high voltage state; and a verification state for simultaneously verifying that all cells in the selected sector have been erased, the state machine transitions to the verification state after the at least one discharge state when a first control signal is in a first logic state.

6. The apparatus of claim 5 wherein the verification state further comprises:

a sense sector current state for checking current drawn by all cells in the selected sector simultaneously to verify all of the cells have been fully erased;

a check sector erase state for checking whether all cells in the selected sector have been erased based on a result of the sense sector current state;

a check pulse count state for incrementing a pulse counter and checking a number of discharge cycles, the state machine transitions to the check pulse count state after the check sector erase state when unerased cells remain in the selected sector; and an erase error state for indicating a failure to fully erase all cells in the selected sector, the state machine transitions to the erase error state after the check pulse count state when the pulse counter indicates a predetermined number of discharge cycles have been performed without fully erasing all cells in the selected sector.

7. Apparatus, for use in conjunction with a non-volatile memory having a plurality of sectors, the apparatus for programming data values into the non-volatile memory, the apparatus comprising:

a memory program finite state machine for controlling programming the data values into the memory, the state machine having a plurality of states including:

a high voltage generation circuit for a high voltage;

a program verify circuit for determining whether selected memory cells in a selected memory array sector have been fully programmed; and a memory program finite state machine, coupled to the high voltage generation circuit and the Program verify circuit, the state machine for controlling erasure of the data stored in the memory array, the state machine having a plurality of states including:

a sub-state machine state for loading the data values from a first memory array into a plurality of bit latches;

a high voltage state for applying the high voltage to a selected word line in a selected sector of a second non-volatile memory array so as to program the data values, the state machine transitions to the high voltage state after the sub-state machine state;

a discharge state for discharging the selected word line, the state machine transitions to the discharge state whenever an abort signal is generated, and the state machine transitions to the first discharge state after the high voltage state;

a set word line voltage state for setting the selected word line to an intermediate positive voltage, the state machine transitions to the set word line voltage state after the discharge state when a program cycle is uninterrupted; after the set word line voltage state the state machine transitions to the sub-state machine state wherein the data values are compared with values in the second memory array;

a program check state for determining whether all of the data values match the second memory array values, the state machine transitions to the program check state after the data values are compared with values in the second memory array in the sub-state machine state;

a check pulse count state for incrementing a pulse counter and checking a number of program cycles, the state machine transitions to the check pulse count state after the program check state when a data match control signal indicates a difference between the second memory array values and the data values; the state machine transitions to the high voltage state after the check pulse count state when the pulse counter has a counter value less than a predetermined value;

a program error state for indicating a failure to program the second memory array values, the state machine transitions to the program error state after the check pulse count state when the pulse counter indicates a predetermined number of program cycles have been performed without programming all of the data values; and a half program done state for determining whether a current program cycle is a first pass program cycle, the state machine transitions to the half program done state after the program check state when a data match control signal indicates the second memory array values match the data values; after the half program done state, when a program cycle control signal indicates the current program cycle is a first pass program cycle, the state machine clears the pulse counter and transitions to the sub-state machine state.

8. The apparatus of claim 7 wherein in the first pass program cycle, data values are loaded into the plurality of bit latches to program a first half of the second data array; and in a second pass program cycle data values are loaded into the plurality of bit latches to program a second half of the second data array.

9. The apparatus of claim 7 wherein the sub-state machine stores a first logic value in a bit latch for each memory cell read by the sub-state machine as having a programmed logic level, so as to prevent any further programming of each such memory cell.

* * * * *